United States Patent [19]
Pew et al.

[11] Patent Number: 5,485,499
[45] Date of Patent: Jan. 16, 1996

[54] HIGH THROUGHPUT REFLECTIVITY AND RESOLUTION X-RAY DISPERSIVE AND REFLECTIVE STRUCTURES FOR THE 100 EV TO 5000 EV ENERGY RANGE AND METHOD OF MAKING THE DEVICES

[75] Inventors: Hans K. Pew, Orem; David D. Allred, Provo, both of Utah

[73] Assignee: Moxtek, Inc., Orem, Utah

[21] Appl. No.: 286,693

[22] Filed: Aug. 5, 1994

[51] Int. Cl.$^6$ .................................................. G01T 1/32
[52] U.S. Cl. .................................... 378/84; 378/145
[58] Field of Search ................................ 378/84, 85, 145, 378/161; 428/DIG. 966

[56] References Cited

U.S. PATENT DOCUMENTS 5,216,539  6/1993  Boher et al. ............................ 378/84
5,349,192  9/1994  Mackay ................................... 378/84

*Primary Examiner*—David P. Porta
*Assistant Examiner*—Don Wong
*Attorney, Agent, or Firm*—Thorpe, North & Western

[57] ABSTRACT

X-ray dispersive and reflective structures utilizing special materials which exhibit improved performance in the specific ranges of interest. The structures are formed of alternating thin layers of uranium, uranium compound or uranium alloy and another spacer material consisting of elements or compounds with low absorptance chosen to match the wavelength of interest. These low index of refraction elements or compounds are those best suited for water window microscopy and nitrogen analysis, or are similar elements or compounds best suited for carbon analysis, boron analysis, and x-ray lithography. The structures are constructed using standard thin layer deposition techniques such as evaporation, sputtering, and CVD, or by novel methods which allow thinner and smoother layers to be deposited.

26 Claims, 12 Drawing Sheets

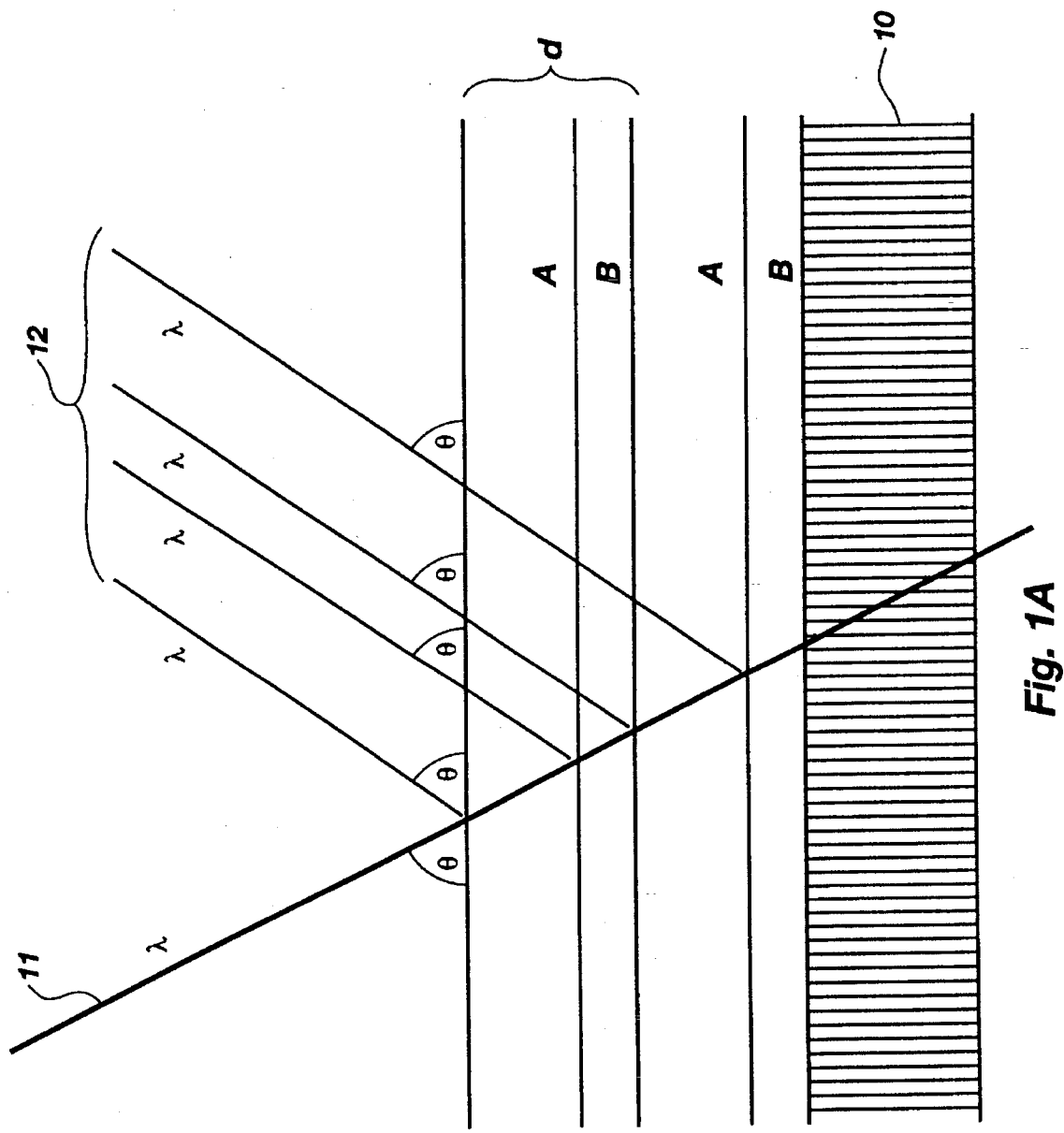

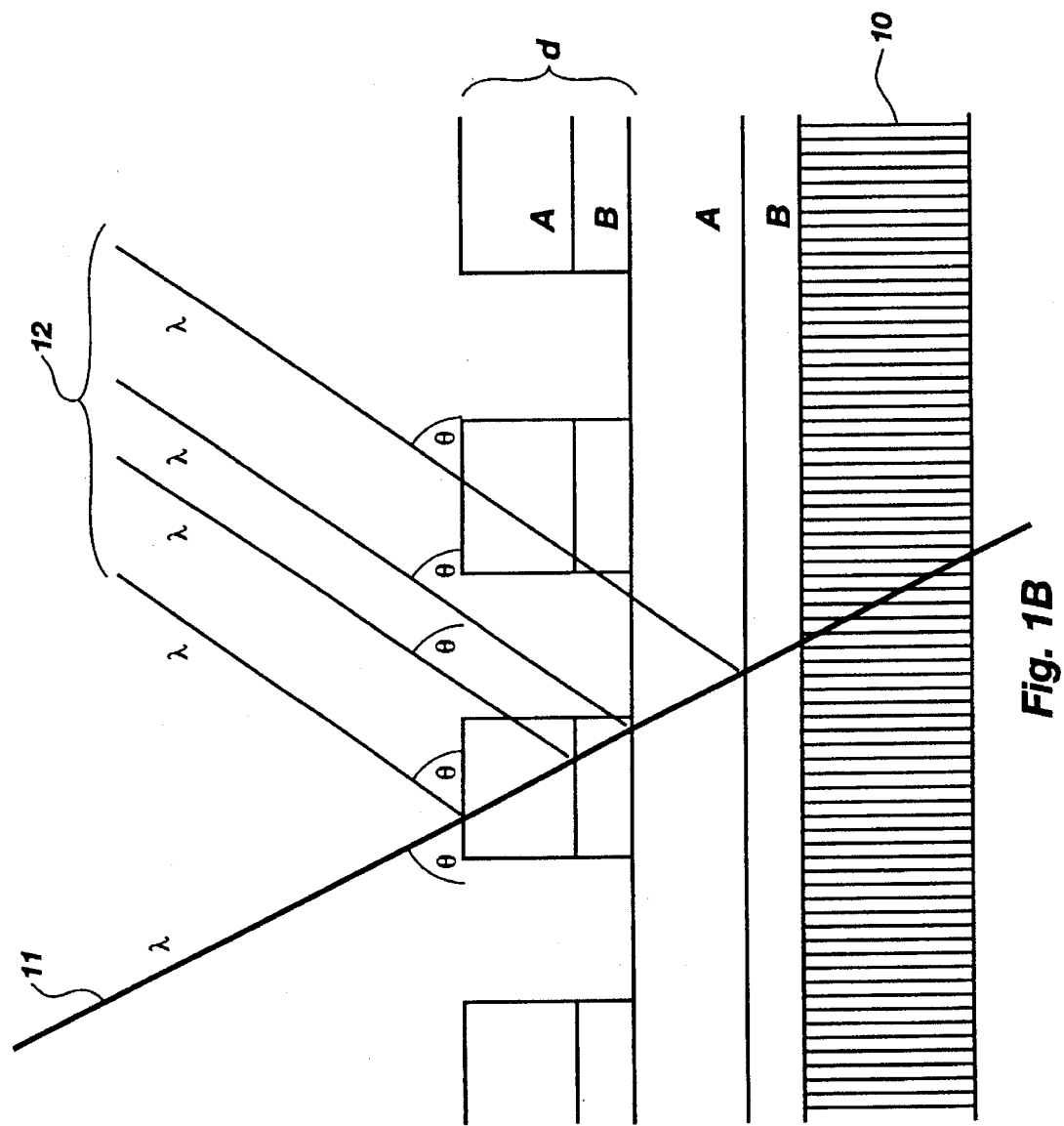

HIGH THROUGHPUT REFLECTIVITY AND RESOLUTION X-RAY DISPERSIVE AND REFLECTIVE STRUCTURES FOR THE 100 EV TO 5000 EV ENERGY RANGE AND METHOD OF MAKING THE DEVICES

BACKGROUND OF THE INVENTION

This invention relates to soft x-ray optics and methods for reflection and dispersion of x-rays having wavelengths within the range of 2.5 Å to 124 Å (100 eV to 5000 eV). More particularly, it relates to the preparation and use of improved x-ray mirrors and dispersion elements operable within this wavelength range in x-ray spectrometers and imaging and non-imaging systems.

The use of x-rays as an analytical tool is currently being applied in many fields of technology. X-ray spectroscopy, for example, is a technique for elemental analysis. Other applications of x-ray analysis arise because x-rays exhibit properties similar to those of light waves generally. Accordingly, x-ray optics have been applied to develop imaging applications in astronomy, biology, medical research, microlithography, thermonuclear fusion, synchrotron radiation and related fields. Numerous devices have been developed for implementing such applications and generally are only as accurate as the optical elements that reflect, refract, or diffract the radiation.

Two applications which are of particular interest in the wavelength region considered here are "water window" x-ray microscopy and x-ray lithography. The water window is a region of the spectrum between the carbon and oxygen K edges, (the K edge is the x-ray energy below which x-rays are not strongly absorbed because they cannot generate a transition of the K electron in the element of interest). Because carbon absorbs much more strongly than oxygen in this region, a high quality optical system designed to work within this range could obtain high contrast images of still living cells in their natural, aqueous environment. This possibility is of such interest that it has long been a focus of research. Many systems have been designed, built and operated with some success despite the poor performance of previous reflective devices. One of the first multilayer systems studied was comprised of alternating layers of vanadium and carbon, V/C, and was intended for operation in the water window region of the spectrum. Many other material pairs have been studied over the past twenty years, in an effort to improve performance in this region, but without success.

Previous x-ray lithography work has focused on 130 Å radiation. Mo/Si multilayers have been developed to achieve very high reflectivity at this wavelength. However, recently, it has become apparent that other considerations will require a working x-ray lithography system to operate at smaller wavelengths. Unfortunately, multilayers designed to work at the desired wavelengths have exhibited relatively poor performance.

Multilayer optics, as developed by Spiller, as discussed in the article Revolution in X-Ray Optics, Journal of X-Ray Science and Technology, 1, 7–78 (1989), can be manufactured using multiple stacked combinations of bi-layered structure having a very small period (10 Å to 200 Å). The bi-layer consists of one layer of material having low absorption and a second layer which operates as a spacer in integral contact with the first layer. The index of refraction of the second or spacer layer is as different from the first as possible. These layers are stacked in multiples to develop an effective reflectivity device which operates approximately according to Bragg's law: $n\lambda = 2\,d\sin\theta$.

The technology to make these structures usually involves sputtering (or some other form of vapor deposition) a material of the desired composition onto a substrate in the form of a thin layer. As used herein, vapor deposition refers to processes by which a bulk deposit is formed on a substrate as individual atoms or molecules arrive at its surface, building it up. As used herein, thin layer means a layer which is sufficiently thin to be optically responsive to incident x-ray radiation by causing reflection, refraction or diffraction. As used herein, reflection, refraction or diffraction will all be identified by the term reflection. For x-ray wavelengths within the range of 2.5 to 125 Angstroms, typical layer thicknesses are from a few Angstroms to over 100 Angstroms. While most of this range may be achieved through standard vapor deposition techniques including sputtering, evaporation and chemical vapor deposition, layers of only a few Angstroms thickness are more difficult to produce. Specialized techniques are required in order to achieve such ultra thin layers of sufficient quality for multilayer optics.

The peak reflectivity that these multilayered, thin films can achieve is primarily influenced by the optical constants, which can be numerically represented by index of refraction and index of absorption values. The value of the appropriate x-ray optical constants of materials is crudely determined by the electron density of the solid films and by electronic transition energy levels within the atoms. As a general rule, heavier elements have relatively high indices of both refraction and absorption, and lighter elements have relatively low indices of refraction and absorption.

In order to obtain high reflection from a multilayered optical device, the alternating layers are selected to maximize the difference in the complex index of refraction ($n = 1 - \delta - i\beta$) between materials comprising the respective layers of the bi-layers while minimizing the absorption. The material with n most different from 1 is often referred to as the absorbing layer. The other layer of the bi-layer is known as the spacer layer.

It is well known that the highest reflecting multilayers use relatively heavy metals or mixtures of heavy metals as the absorbing layer. Such elements as molybdenum, tungsten, iron, nickel, tantalum, vanadium, rhenium, or ruthenium have been used for the absorbing layer. Elements with high atomic number tend to have larger indices of refraction ($\delta$), especially when their density is also high. However, these elements also tend to have higher indices of absorption ($\beta$), which degrades multilayer performance. This creates a trade off which makes material selection more difficult. Experience has shown that at most wavelengths within the soft x-ray region best absorbing materials tend to fall into one of three groups. These groups are:

V-Ni group consisting of V, Cr, Fe, Co and Ni

Zr-Rh group consisting of Zr, Nb, Mo, Ru and Rh

Hf-Os group consisting of Hf, Ta, W, Re and Os.

These groups correspond to portions of the 3d, 4d and 5d transition metal groups in the periodic table, respectively. They are also characterized by their refractory and high density similarities.

Theoretical performance at a given wavelength is often remarkably similar within a group, and the best group depends on the wavelength of interest. It has long been known that the best group over much of the 100 eV to 500 eV x-ray range is the V-Ni group. This accounts for the early attempts to manufacture V/C multilayers, and the extensive recent work by many researchers using every other element in this group with the possible exception of Co.

Unfortunately, the V-Ni group has the lowest atomic numbers of the three. Because the atomic number is lower, both the absorption and the index of refraction are relatively small. The theoretical superiority of this group is due more to uncharacteristically poor performance for the other groups rather than good performance for the V-Ni group. Thus, even the theoretical performance of the best existing multilayers for this region of interest is low when compared to the theoretical performance of the best multilayers in other regions of spectrum.

The spacer layer also poses unusual difficulties over much of the wavelength range of interest. Commonly used spacer materials are carbon, boron, and silicon. However, while carbon and boron are good choices over some of the range considered here, above about 290 eV both have relatively high absorption. Therefore, other materials, with low absorptance, such as scandium, titanium, sodium, calcium, and lithium are required.

The discussion above has considered only the optical properties of the materials in question, but in actual multilayers other considerations are as important. In order to obtain performance approaching the theoretical values obtained from the optical constants, it must be possible to deposit both materials in thin, alternating layers. Good control over thickness and extremely smooth, abrupt interfaces are required. The usual approach to this problem is to attempt to deposit amorphous layers, or if that is not possible to obtain polycrystalline layers with extremely small grain sizes. Another more difficult, but potentially very rewarding approach, is to deposit oriented crystalline materials epitaxially layer by layer. In any case, the materials should also be refractory and chemically stable, as reactions or diffusion at the layer boundary can smear the boundary and significantly degrade performance. Also, reactions with atmospheric gasses and other common airborne contaminants such as sulfur can destroy the layer structure. These considerations can greatly restrict the possible materials.

Lithium, sodium, magnesium, potassium, and calcium would all make good low index materials at many wavelengths, based on their optical properties, but they have never been successfully used due to their high reactivity. Most of the elements in the V-Ni group have problems in this regard. Though some of them are not overly reactive, they are perhaps not refractory enough and are difficult to deposit in smooth layers. The most commonly and successfully used high index materials are tungsten and molybdenum. Both of these materials are highly refractory, with melting temperatures of 3410° C. and 2610° C. respectively. This quality cannot be over emphasized. Smoothness and resistance to layer interdiffusion is so critical and so difficult to obtain that no commercially successful multilayers have been developed using an absorbing material with a melting point below 1400° C.

The standard approach to multilayer design is to select the spacer material first. This is done because the system tends to be more sensitive to changes in the spacer material. Then the absorbing material is selected to be compatible with the spacer material. Usually the absorbing material is selected from the V-Ni group, the Zr-Rh group, or the Hf-Os group. When a material outside of these groups is selected the choice is almost always based on superior material properties, especially in combination with the already chosen spacer material. However, the results of experiments which used elements outside of these groups have never yielded results as good as those obtained by using elements within the groups.

The invention disclosed herein departs from long-established selection criteria as discussed above and identifies uranium composition as having surprising utility. By choosing uranium, not only have we have gone outside of the three preferred groups but we have also chosen an element without the normal good material properties to recommend it. Uranium belongs to the actinide series of elements which more closely resembles the lanthanide or rare earth elements in their chemical and physical properties. Uranium and the lanthanides tend to be quite chemically reactive and relatively low melting, unlike the transition metals usually selected. To our knowledge, the rare earth elements have never been used in commercially available soft x-ray optics.

Due to the fact that uranium is highly reactive and will burn in air at temperatures not greatly in excess of room temperature it has not previously been considered for use in multilayers. It forms oxides immediately in air which causes rapid disintegration of uranium thin film structures. Thus any multilayer containing uranium must be both carefully made and well protected from exposure to the normal environment.

Uranium's melting point is only a moderate 1132° C., as opposed to >>2000° C. for the most successful high index materials. Moreover, its atomic density is also only moderate. The mass density of uranium is less than that of tungsten, rhenium, osmium, iridium, platinum and gold, despite the much higher atomic weight of uranium.

Recent information in the literature indicates that the optical properties of uranium may be promising in the wavelength range of interest, however, we found that fabrication of uranium containing multilayers with adequate layer structure is possible, though not trivial. Actual measurements of fabricated uranium containing multilayers have shown that, contrary to prior art expectation based on the body of evidence and experience, properly designed and manufactured uranium containing multilayers can be superior to those constructed from the V-Ni group typically used for this wavelength range.

OBJECTS AND SUMMARY OF THE INVENTION

An object of this invention is to disclose a device and method for creating multilayered reflection with enhanced reflectivity and resolution in the 100 ev to 5000 eV portion of the soft x-ray spectrum.

A further object of this invention is to provide such a device which offers diversified applications involving the reflection, refraction or deflection of x-rays within this energy range.

These and other objects are realized in a method for preparing a multilayer reflective device for x-ray radiation comprising the steps of (i) selecting a substrate having a smooth surface suitable for receiving a reflective coating operable within the x-ray energy range of 100 eV to 5000 eV, (ii) applying over the substrate a thin layer of uranium composition selected from the group consisting of uranium, uranium compound, uranium alloy and mixtures thereof, and (iii) applying to the layer of uranium composition a thin spacer layer optically compatible with the uranium composition to enable reflection of the x-ray radiation. Steps (ii) and (iii) may be reversed to form an inverted layer of uranium composition and spacer. This pattern is continued to form alternating layer pairs as part of the multilayered device.

Also disclosed is a device for reflecting and dispersing soft x-rays of energy within the approximate range of 100 eV to 5000 eV, comprising a substrate having a smooth surface suitable for receiving a reflective coating operable within the x-ray energy range of 100 eV to 5000 eV and a plurality of alternating thin layers respectively including (i) a uranium composition and (ii) spacer material, in either order. The uranium composition is selected from the group consisting of uranium, uranium compound, uranium alloy, and mixtures thereof. The layers are arranged in any alternating order and are positioned on the substrate as a reflective coating, each layer having a thickness which causes reflection or dispersion of x-rays within the range of 100 eV to 5000 eV which are incident upon the layers.

Multilayer reflection devices have been previously developed for this region but the reflectivity and resolving power have been very low. By using uranium and uranium containing materials for the absorbing layer and optically compatible materials for the spacer layer, each layer pair being repeated from 5 to 500 times, a multilayer optic of superior performance can be produced for the energy range of interest. A wide variety of materials for use in combination with the uranium are discussed for use at the various energies of interest, each material having certain properties which make it optimum for the energy range specified. Methods of utilization of the various uranium containing multilayered devices is also disclosed. Selected methods of manufacture with alternatives are also disclosed.

BRIEF DESCRIPTION OF THE DRAWINGS

FIG. 1A is a schematic of a typical multilayer optic of the type used in x-ray dispersive systems.

FIG. 1B is a schematic of a grating type multilayer optic which can also be used in x-ray dispersive systems.

DETAILED DESCRIPTION OF THE INVENTION

Figure 2A:
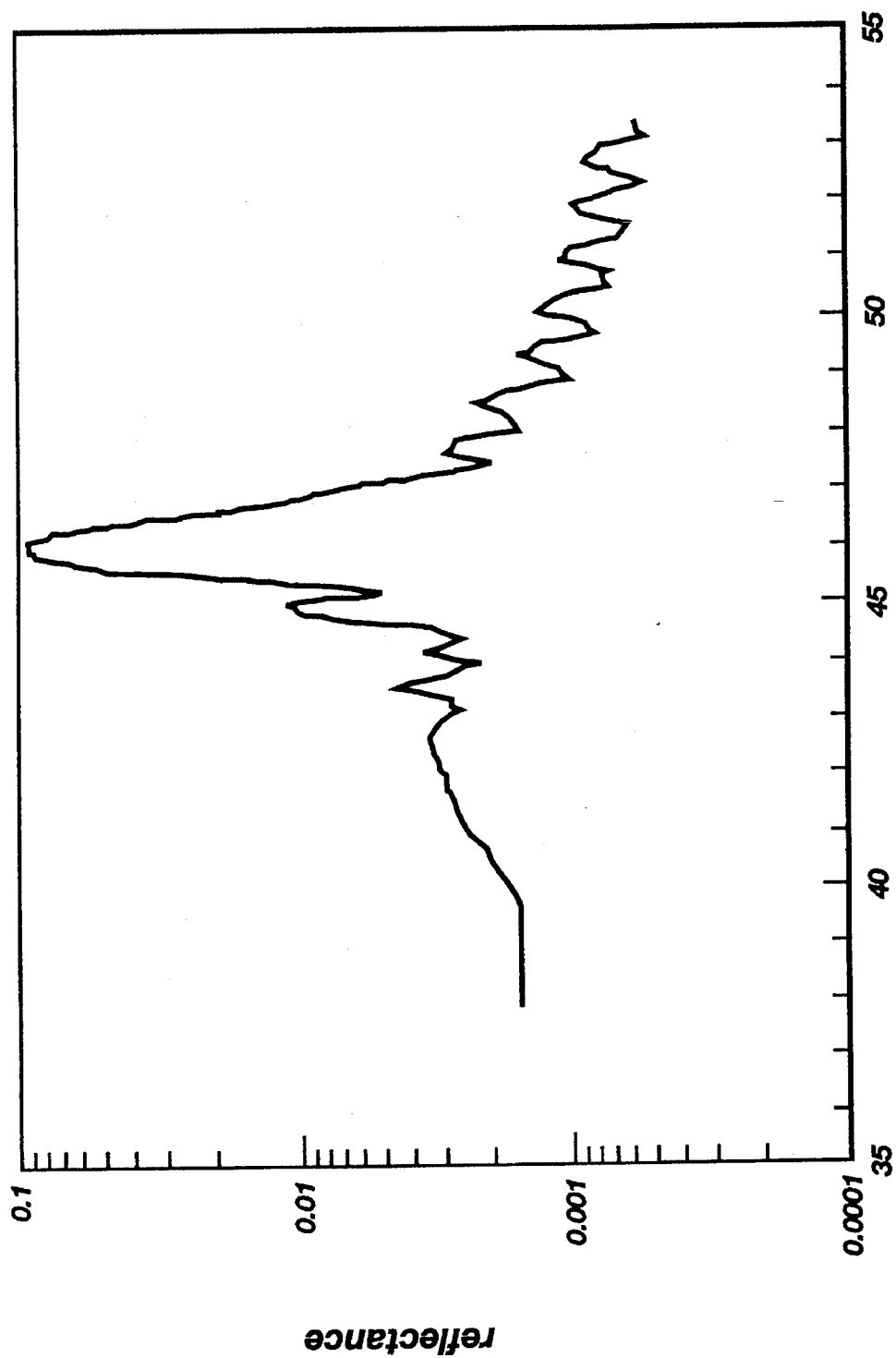
FIG. 2A is a plot of the reflection versus frequency of a U/C multilayer.

FIG. 1A is a schematic cross section representation of a typical multilayer optic which would be used in an x-ray dispersive system. In this example only two layer pairs are shown, while in normal usage, the layer pairs would vary from 10 to 500 or more. Alternating layers of material represented by "A" (herein designated as the uranium containing layer) and "B" (herein designated as the spacer layer) are deposited upon a substrate 10. Two of such layers comprise a period which has a thickness represented by the distance "d". The substrate 10, may be silicon or a composition having a smooth surface whose physical characteristics are suitable for supporting a reflective coating operable within the x-ray wavelength of 2.5 to 125 Angstroms. This schematic example has a planar surface; however, it will be known to those skilled in the art that curved surfaces and contours can likewise be utilized.

This construction begins with a first layer of A or B. Additional layers are deposited, one upon another, in alternating sequence as illustrated. It should be noted that the sequence can begin and end with either A or B, as long as the alternating order is maintained. The number of layers will be determined, in part, by the extent of reflectivity and resolution desired.

Superimposed over the multilayered matrix are reflected rays 12 representing reflections of incident radiation 11. In order for the multilayer to exhibit significant reflectivity, these reflections must add together in phase. This condition occurs when the Bragg equation $n\lambda = 2 d \sin \theta$, subject to a correction that results from the complex refractive indices $n_A$ (for the material A) and $n_B$ (for the material B), is met.

The A layer consists of uranium or a compound or alloy containing uranium. The other layer material, or spacer, is chosen to fit the application. In a preferred embodiment of the invention, uranium containing multilayers are described by the symbol UX/LE, where U is uranium, X is a light element or combination of light elements including, for example, the elements N, C, H, or O where the element X forms a stable, high density compound with uranium. LE is a light element selected so as to be stable in the presence of UX and to further permit the operation of the optic at the wavelength of interest.

FIG. 1B is a schematic representation of a uranium containing multilayer diffraction grating. A preferred embodiment of this type of multilayer is obtained by either depositing the multilayer onto a suitably etched surface or by depositing the multilayer on a flat surface and then etching the grating pattern into it. In this embodiment, a uranium containing layer, A, and an appropriate spacing layer, B, are alternatively deposited upon a substrate 10 to the desired layer thickness. A pattern is then etched in the multilayer structure by a photolithography method or direct etch E-beam method. Only two layers of the alternating uranium and spacer material are shown, although in practice there would be many layers of the pattern structure and many layers of structure between the pattern structure and the substrate. Once again, the incident radiation 11 is reflected as it strikes each layer interface resulting in the rays 12 according the Bragg equation. In this embodiment, the pattern creates, if the appropriate materials, spacing and grating period are chosen, a narrow bandpass filter with the benefit of providing increased spectral resolution. This same structure can also be used as a beam splitter as in the embodiment in FIG. 8. In all other ways the grating structure is similar to the structure in FIG. 1A.

FIG. 2A. shows the absolute reflectance, as measured at NIST, (National Institute of Science and Technology, Greenbelt, Md.), of a uranium containing multilayer. This multilayer, designated as UXC004, consisted of 63 layer pairs with a period ("d") of close to 30 Angstroms. The uranium containing layer consists of uranium and uranium carbide, while the spacer layer consists of carbon. The ratio of the thicknesses of the uranium containing layer to the carbon layer is approximately 1 to 1.5. The measurement is made at an incident angle of 45 degrees from normal, and the response is measured as a function of wavelength. A maximum reflectance of 10% is obtained at 46 Angstroms.

Figure 2B:
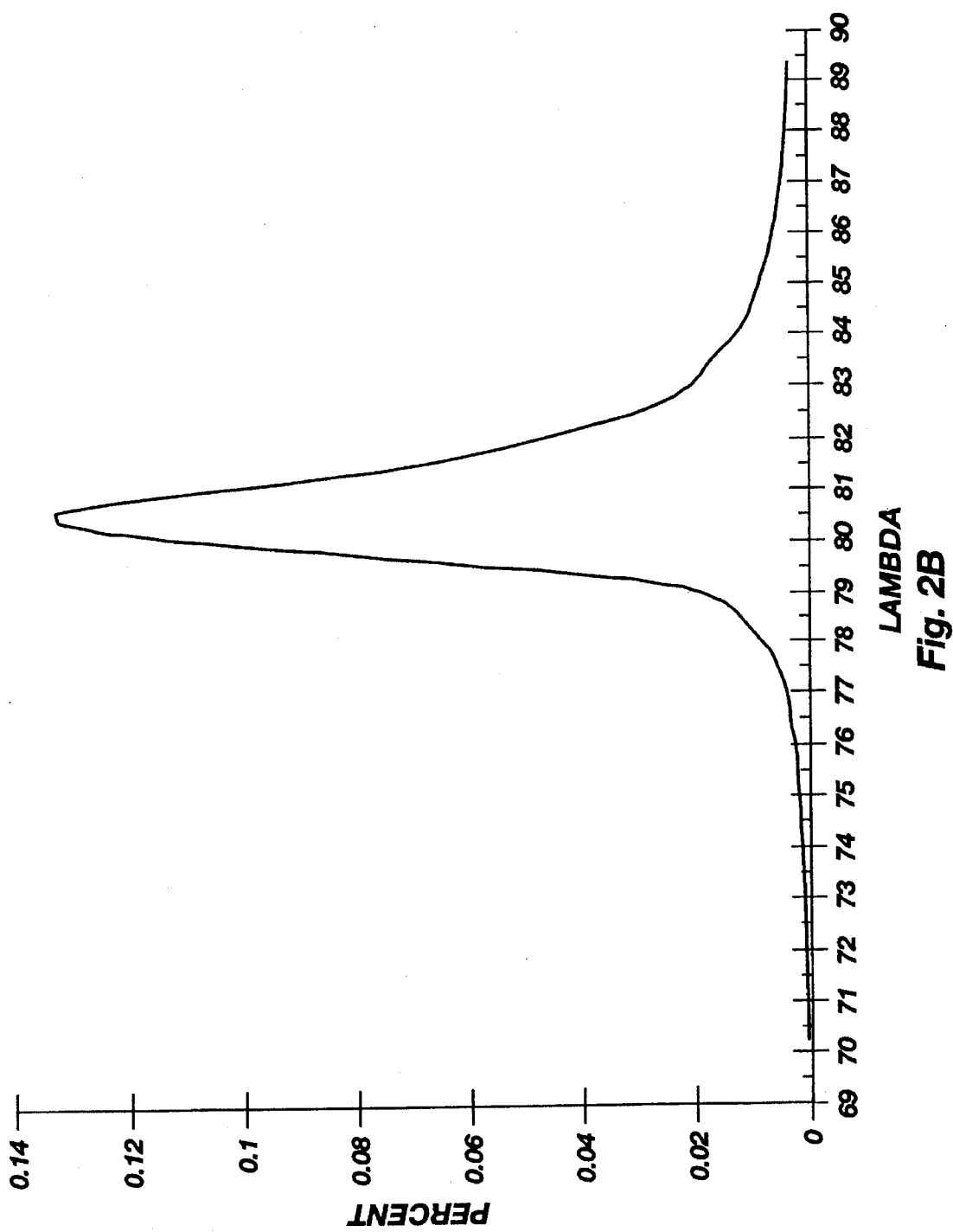
FIG. 2B is a plot of the reflection versus frequency of a second U/C multilayer.

FIG. 2B shows the absolute reflectance, as measured at NIST, of a uranium containing multilayer. This multilayer, designated as UXC011, consisted of 60 layer pairs with a period ("d") of close to 40 Angstroms. The uranium containing layer consists of uranium and uranium carbide, while the other layer consists of carbon. The ratio of the thicknesses of the uranium containing layer to the carbon layer is approximately 1 to 2. The measurement is made at an incident angle of 5 degrees from normal, and the response is measured as a function of wavelength. A maximum reflectance of almost 14% is obtained at 80.5 Angstroms.

Figure 3:
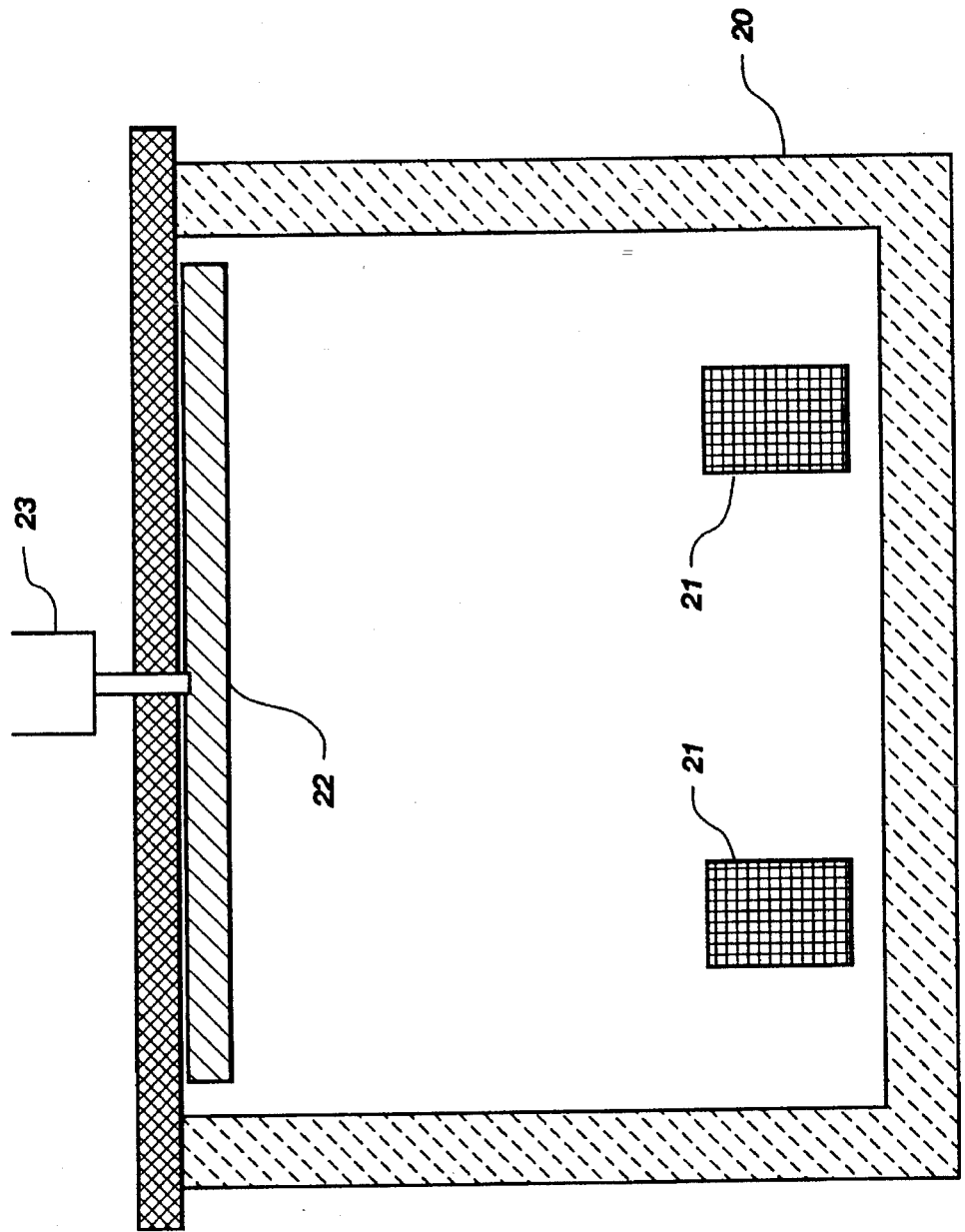
FIG. 3 is a schematic representation of a typical sputtering apparatus employed in the preparation of uranium containing multilayers.

FIG. 3 shows a typical sputtering apparatus employed in the preparation of uranium containing multilayers for soft x-ray optics. In one technique used in preparing an embodiment of the invention, the sputter system consisted of a 1 (one) meter diameter, cylindrical chamber 20 about 60 centimeters high. In the bottom of the chamber 20 are placed two dc magnetron sputtering guns 21 which sputter upward. The sputter cathodes are 4 inches in diameter.

In preparing a preferred embodiment employed for energies less than the carbon edge (290 eV), the uranium containing target is elemental uranium and the spacer material is carbon. The uranium target is cut from a sheet of depleted uranium (uranium 238 with a lower than natural fraction of uranium 235). One preferred manufacturer of uranium sheet is Manufacturing Sciences of Oak Ridge, Tenn. although uranium of the quality desired may be obtained from other sources. The carbon cathode is graphite and is typical of those common in industry. The substrates are mounted on a rotating carousel 22 and face downward towards the sputter guns. Both sources are ignited simultaneously. Periodic multilayering is due to the fact that as the carousel is constrained to rotate, the substrates pass successively over each of the sputter guns for a precisely determined length of time. Each substrate on the carrousel is also revolved about a vertical axis at a rate much higher than the rotation rate. The purpose of the revolution of the substrate is to improve the uniformity of each layer laterally across its surface.

In a preferred embodiment of the invention the first layer is carbon. In a more preferred embodiment the first and last layers are carbon. It was found that uranium containing multilayers are subject to in air degradation. This can be retarded by having small values of gamma, that is small uranium thickness.

Another preferred embodiment is for multilayers which deliberately contain substantial amounts of elements other than uranium in the uranium containing layer for use in applications where the x-ray energies can be less than or greater than the carbon edge. The example now discussed specifically describes how the multilayers are prepared using sputtering and using nitrogen as the additional element in the uranium layer, but other deposition techniques are possible and carbon or other elements could be substituted all or in part for the nitrogen by adding the appropriate gases to the working gas mixture in the sputter system. This class of multilayers is especially useful for application for energies less than the carbon edge (290 eV), since the spacer material is carbon, but applications in the water window are also possible and several examples will be discussed.

In a preferred embodiment the working gas in the sputtering chamber contains nitrogen gas in addition to the normal inert gas. In the art this is known as reactive sputtering. This gas is found to stabilize the multilayer and to enhance the smoothness, crystallinity, and inertness of the uranium layer and the sharpness of its interface with the spacer layer.

In a preferred embodiment of the invention the nitrogen and argon gasses are introduced separately into the chamber. The argon flow rate is set to achieve the pressure required to maintain the plasma necessary for the process. The nitrogen flow rate on the other hand is not monitored per se. Instead we disclose that a preferred way to set the nitrogen flow is to set the nitrogen partial pressure in the sputter system to approximately 1 to $3 \times 10^{-5}$ torr when the sputter guns are in operation. The partial pressure is measured using an in-line mass spectrometer. The actual flow rate of nitrogen is much larger than suggested by the partial pressure of nitrogen at the time the guns are in operation. The residence time of argon in the chamber is rather long and depends on the extent to which the vacuum pump is throttled. The argon does not react with the film or targets and is removed only as it flows out through a throttle valve to the cryopump below. Nitrogen, however, can react with the sputtered atoms and the surfaces of the targets and the growing films. Therefore, its partial pressure is much smaller than that of the argon even for comparable flow rates. We find that a preferred and reproducible way to control the nitrogen entering the films is thus to monitor the amount of nitrogen that is in the gas phase. Typically, the actual nitrogen flow will be in the range of several tenths of the flow rate of argon when the partial pressure in the system is $1 \times 10^{-5}$. This is about 0.3% for a typical total gas pressure of $3.1 \times 10^{-3}$ torr.

The effect of nitrogen on the multilayers is seen at the lowest pressure which can be reproduced which is about $1 \times 10^{-5}$ torr. A preferred range for producing environmentally stable multilayers is 2.5 to $3.5 \times 10^{-5}$ torr. There is a maximum preferred pressure for $N_2$ in the sputtering environment. Above the flow rate corresponding to this pressure the partial pressure rises extremely rapidly and can be called erratic. An interpretation of this behavior is that there is at the maximum preferred pressure enough nitrogen flowing in to entirely saturate the atoms and surfaces produced by sputtering. Any excess $N_2$ retards the sputtering by continuously covering the surface of the metallic uranium sputtering target with a layer of strongly bonded nitrogen atoms that continually must be removed to get to the uranium target surface which is the source of the uranium atoms.

Figure 4:
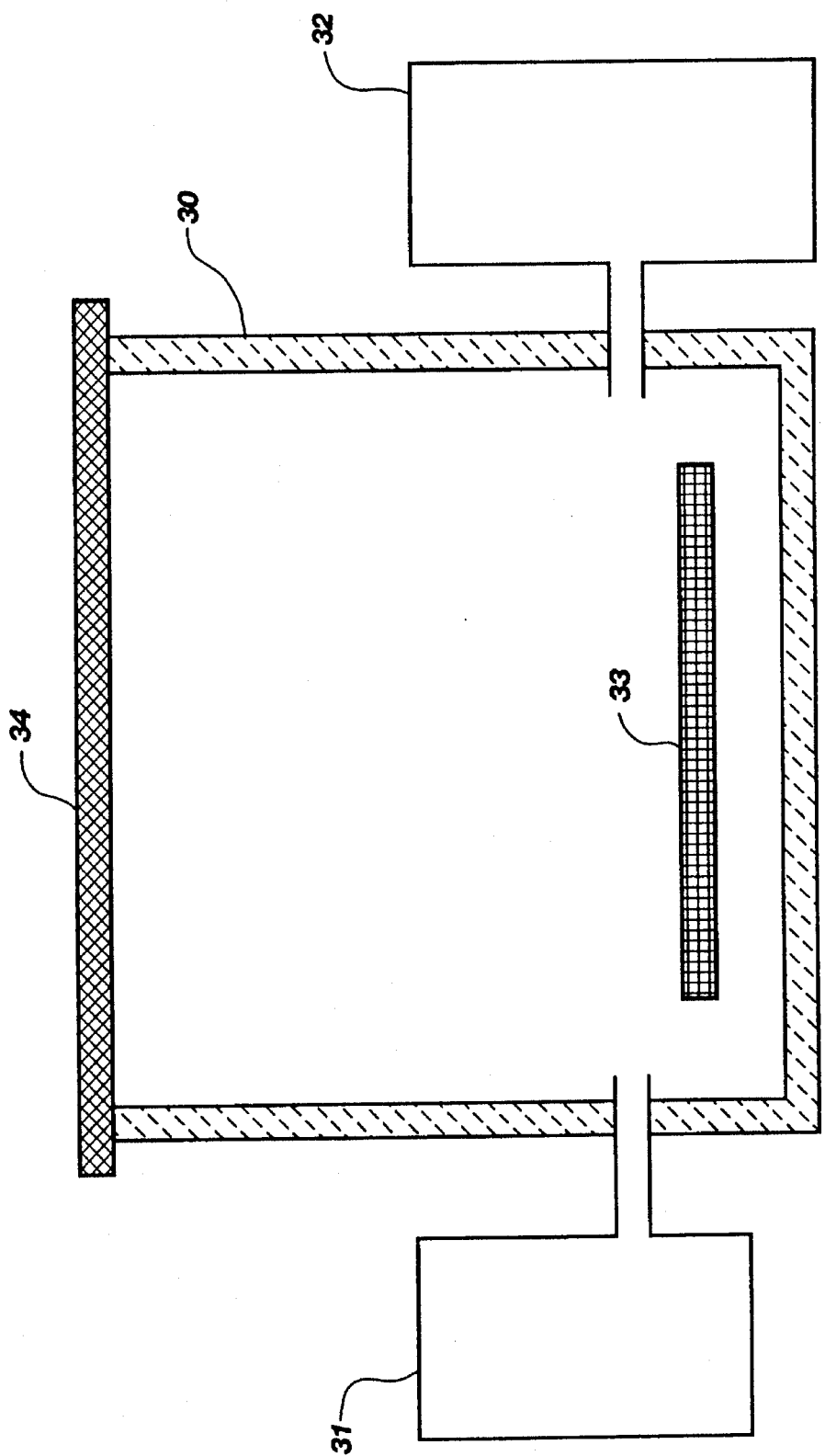
FIG. 4 is a schematic representation of a system for depositing uranium containing multilayers by atomic layer epitaxy (ALE).

FIG. 4. is a schematic representation of a system for depositing uranium containing multilayers by monolayer epitaxy. This is a novel method for obtaining high quality multilayers with very small period. One embodiment of this invention is a set of multilayers termed: the UX/LE multilayer. In this case, U is uranium in combination with X which is an element or combination of elements other than uranium. The symbol LE stands for a spacer layer compound that is stable in the presence of UX and can readily be prepared by monolayer epitaxy at the temperatures and conditions that produce UX. It is preferably, but not limited to, nanocrystalline rather than amorphous compounds. Monolayer epitaxy is a special case of chemical vapor deposition, where, not only is it desirable to have one monolayer of material deposited with each operation, but control is established over the morphology of the monolayer of deposited material so that the surface of the sample does not roughen but rather perfectly replicates the substrate.

In this embodiment, a deposition chamber 30 contains a sample holder 33 which may or may not be planar and which can heat the sample to the necessary temperature in order to achieve monolayer deposition. A vacuum pumping system 31 capable of achieving relatively high levels of vacuum is connected to the deposition chamber 30 and used to remove all or almost all gas from the chamber. A gas input system 32 provides the necessary gasses or combinations of gasses of the type necessary to deposit monolayers of the desired material. The top of the chamber 34 can be removed for service and for placing the substrate into the deposition chamber. The uranium containing multilayers made with this process are designed specifically for energies from 100 eV to 5000 eV and preferably for the range of 160 eV below to 120 eV above the carbon absorption edge.

Figure 5:
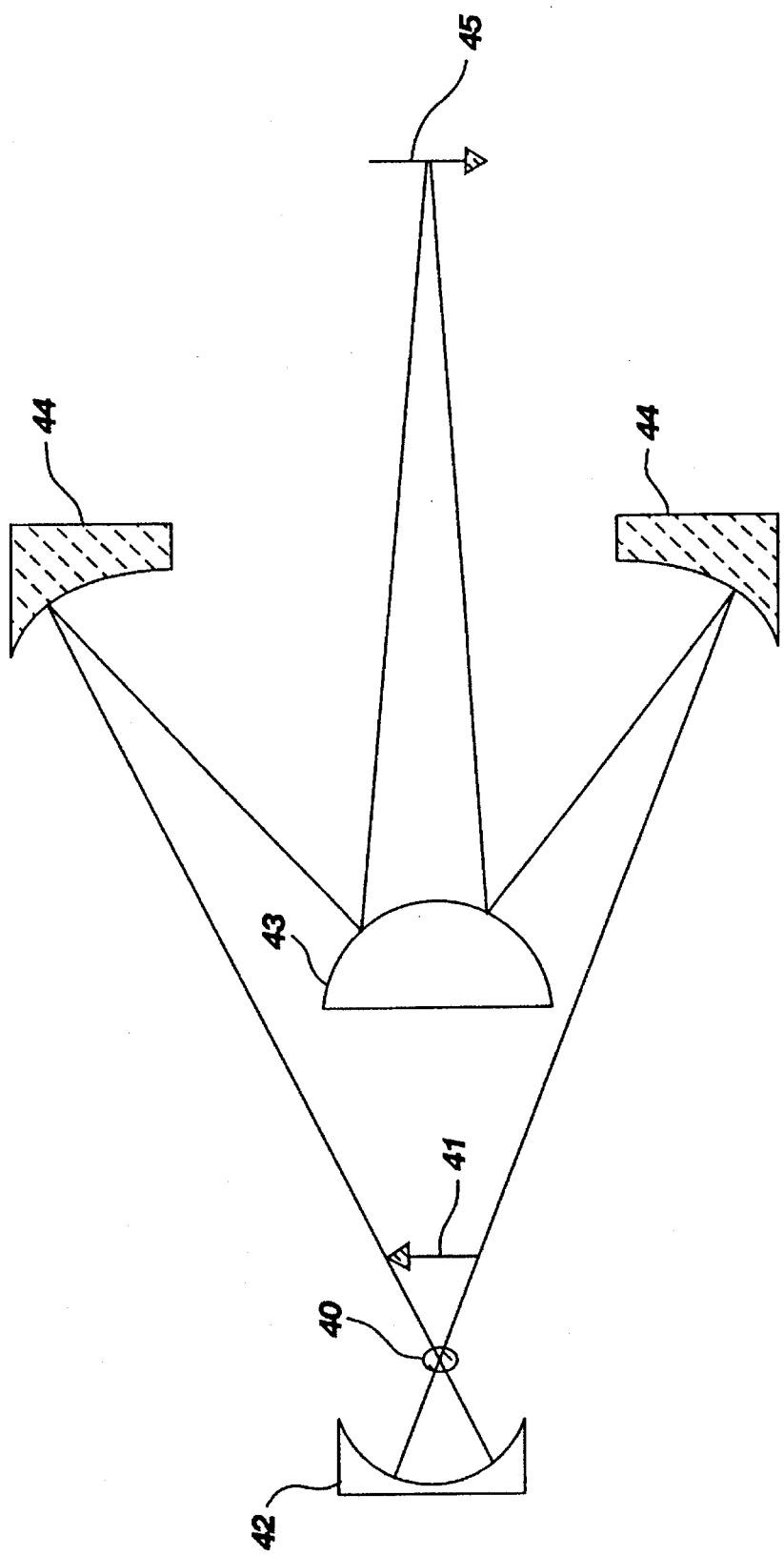
FIG. 5 is a schematic representation of a Schwarzschild microscope designed to work in the water window.

FIG. 5. is a schematic representation of a Schwarzschild microscope utilizing uranium containing multilayers designed to work in the water window. In this embodiment, an object 41 is placed at the correct position for operation. A highly collimated, very bright source of x-rays 40 provides the illumination. A condensor lens 42 coated with an appropriate uranium multilayer surface directs the source x-rays past the object 41 and impacts upon the primary lenses 44. As used herein, a condensor is defined as a figured optical surface or series of surfaces for the purposes of collecting, collimating and directing radiation from a source. These lenses are also coated with an appropriate uranium containing multilayer. The x-rays are then directed to the secondary lens 43 which is similarly coated. The image is then reconstructed in the viewing plane 45 with the necessary magnification.

In a more preferred embodiment for the "water window", where carbon is absorbing and oxygen and nitrogen are relatively transparent, X is preferably substantially nitrogen, not carbon. Some oxygen content is allowed. In a more preferred embodiment for this application, LE is substantially free of carbon and X is not carbon. In another preferred embodiment for the water window, X is an alloying element used to block uranium corrosion including but not limited to Si, Co, Ni, Ta, W, Re, Os, Ir and Pt.

In a more preferred embodiment of the uranium containing multilayer UX/LE, LE compounds, for energies within the "water window" but below the absorption edge of nitrogen, include, preferentially nitrides, [including, but not restricted to: ScN, $Ca_3N_2$, $Mg_3N_2$, $Be_3N_2$, $K_3N$, $Li_3N$, $Na_3N$, $TiN_{1-x}$] and oxides, [including but not restricted to: $ScO_{1-x}$, CaO, MgO, BeO, $K_2O$, $Li_2O$, $Na_2O$, $TiO_{1-x}$] hydrides, including among others: $ScH_x$, $CaH_x$, $KH_x$, $MgH_x$, $NaH_x$, and $LiH_x$ and mixtures of these compounds. At energies below the energy at which C is strongly absorbing, LE compounds include preferentially carbides, including: $ScC_x$, $CaC_2$, $MgC_x$, $Be_2C$, $Li_2C_2$ and the above mentioned hydrides, oxides, nitrides and mixtures.

Figure 6:
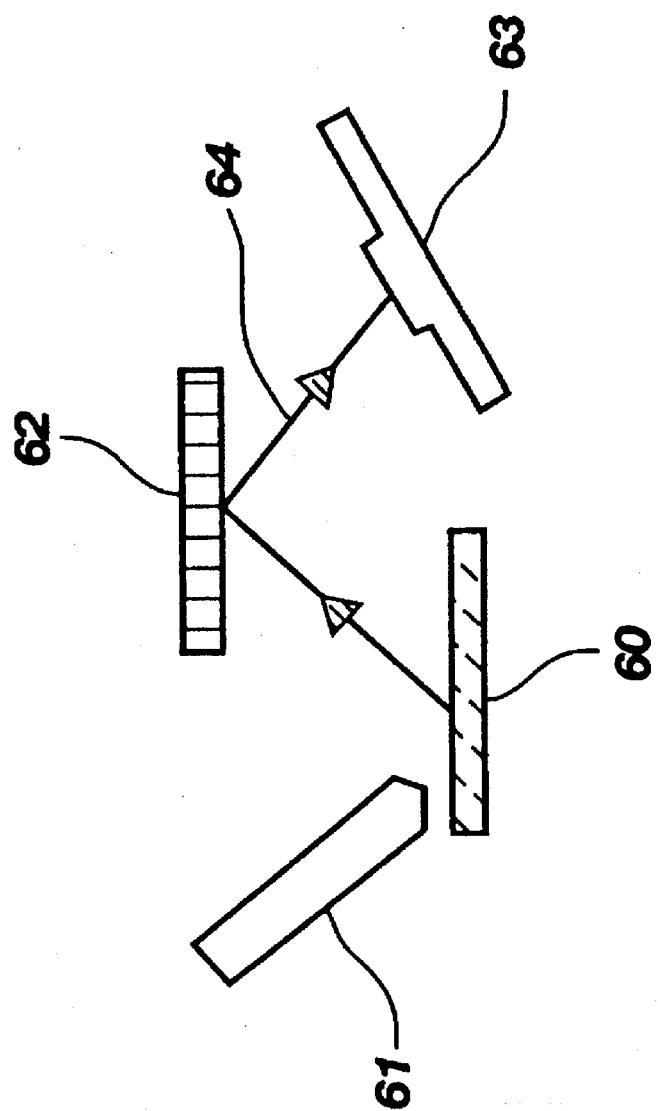
FIG. 6 is a schematic representation of a simple spectrometer of the type typically used for elemental analysis.

FIG. 6. is a diagram of a typical x-ray spectrometer utilizing this invention and used for elemental analysis. In this embodiment, the sample 60 is placed in the beam of an x-ray source 61. The sample 60 emits characteristic x-rays based upon the amount and the type of elements which make up the sample. A multilayer optic 62 collects the x-rays emitted 64 from the sample and based upon the d spacing and the angle, directs the emitted x-rays 64 to the detector 63. In this embodiment, the dispersive element is a uranium containing multilayer. Uranium containing multilayers with appropriate spacing compounds, UX/LE, where U is uranium and X is either a light element such as carbon and/or nitrogen or corrosion resistant elements such as Si, Co, Ni, Ta, W, Re, Os, Ir and Pt, and LE is substantially either carbon or boron, should offer superior performance when used to reflect the frequencies generated by a sample containing boron, carbon or nitrogen.

In a more preferred embodiment of the uranium containing multilayer UX/LE, LE compounds, for energies within the "water window" but below the absorption edge of nitrogen, include, preferentially nitrides, [including, but not restricted to: ScN, $Ca_3N_2$, $Mg_3N_2$, $Be_3N_2$, $K_3N$, $Li_3N$, $Na_3N$, $TiN_{1-x}$] and oxides, [including but not restricted to: $ScO_{1-x}$, CaO, MgO, BeO, $K_2O$, $Li_2O$, $Na_2O$, $TiO_{1-x}$] hydrides, including among others: $ScH_x$, $CaH_x$, $KH_x$, $MgH_x$, $NaH_x$, and $LiH_x$ and mixtures of these compounds. At energies below the energy at which C is strongly absorbing, LE compounds include preferentially carbides, including: $ScC_x$, $CaC_2$, $MgC_x$, $Be_2C$, $Li_2C_2$ and the above mentioned hydrides, oxides, nitrides and mixtures.

In a more preferred embodiment of the uranium containing multilayer, UX/LE, for energies less than the carbon K edge, where carbon is not absorbing and oxygen and nitrogen are also relatively transparent, X is preferably carbon. In a most preferred embodiment LE is substantially carbon.

In a more preferred embodiment for energies much less than the carbon K edge, where boron is not absorbing and carbon, oxygen and nitrogen are also relatively transparent, X is preferably boron or a chloride such as KCl or LiCl.

Figure 7:
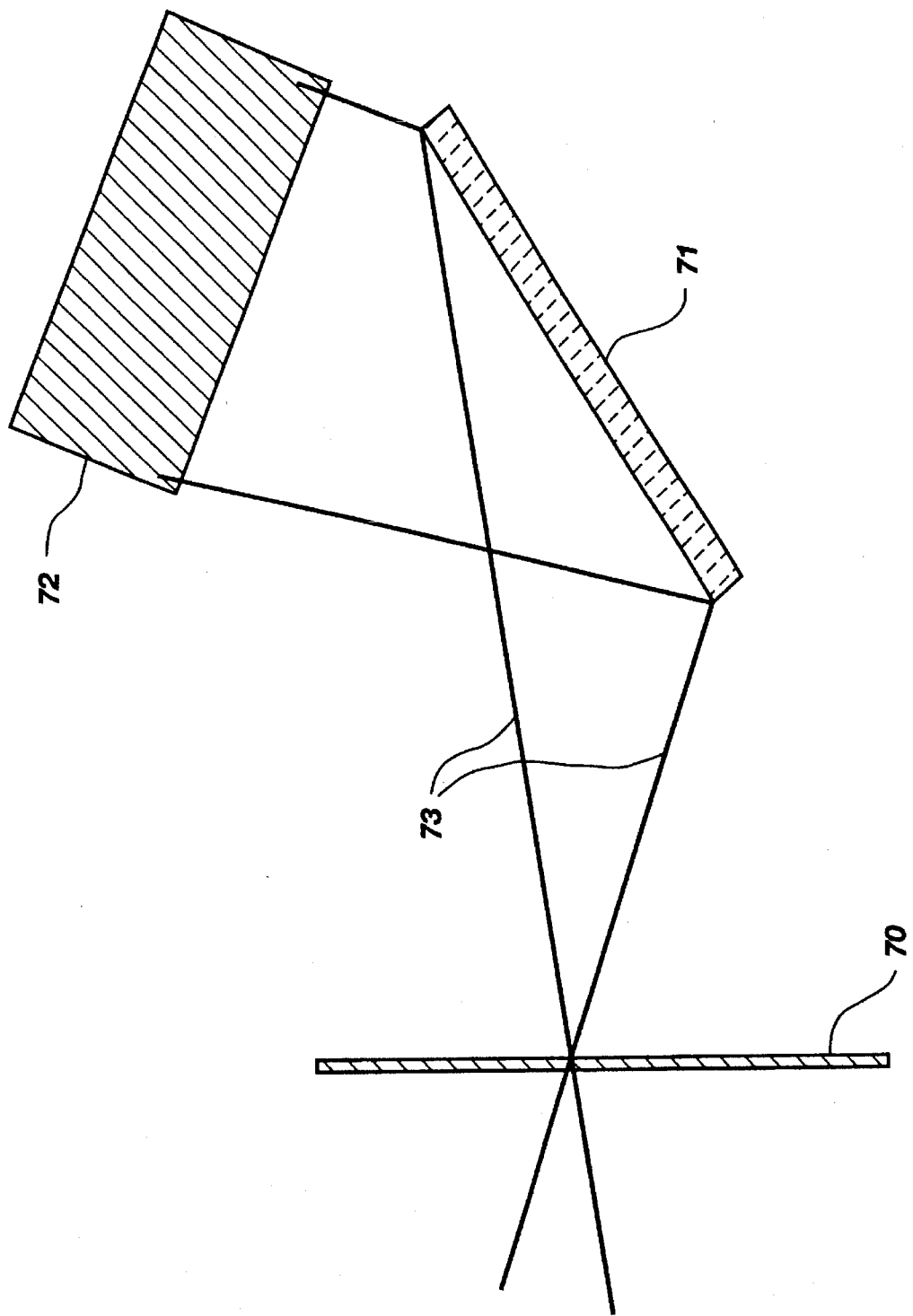
FIG. 7 is a schematic representation of a fusion diagnostic device.

FIG. 7 is a block diagram of a fusion diagnostic device utilizing the invention. In this embodiment, the x-rays 73 generated by a fusion source would pass through a pinhole aperture 70 and strike a laterally graded, uranium containing multilayer 71. The multilayer reflects the x-rays 73 of a particular frequency of interest to the researcher into a detector 72. Once again, the parameters of the uranium containing multilayer 71 are necessarily selected to achieve the desired results. This type of apparatus can be used to provide information about impurity distribution in the plasma.

Figure 8:
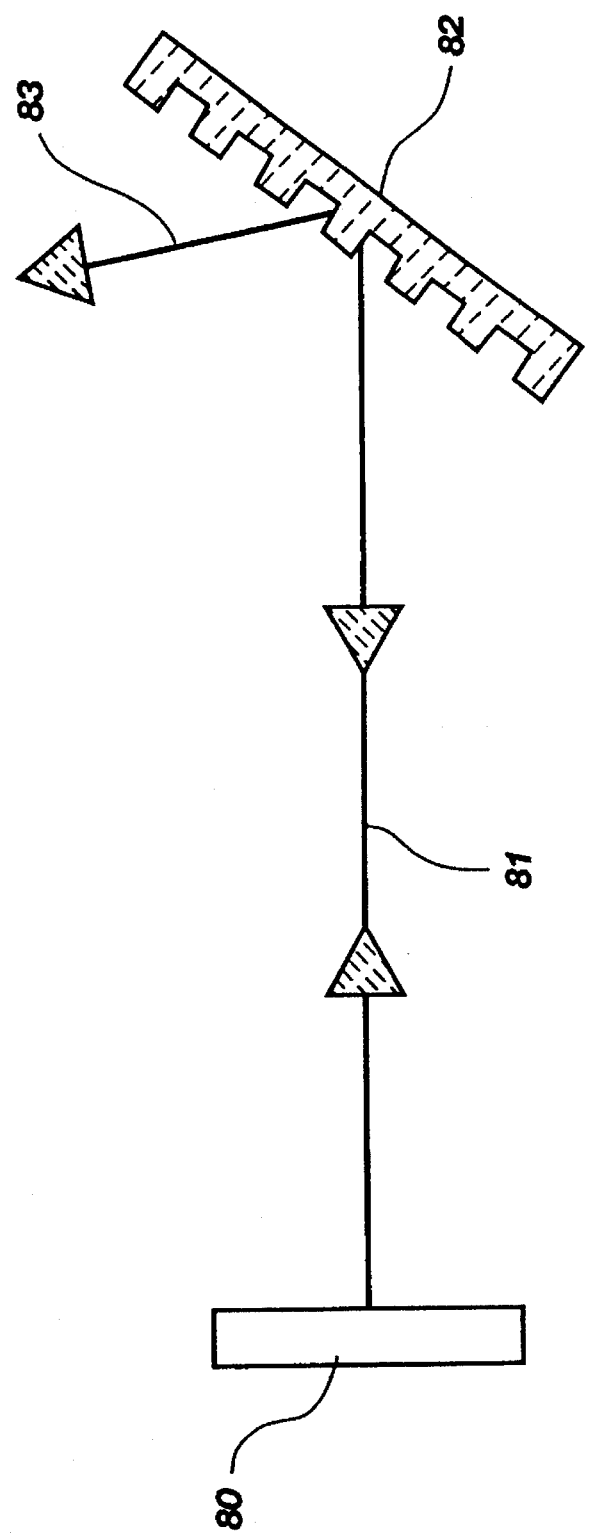
FIG. 8 is a schematic representation of an x-ray laser cavity.

FIG. 8. is a schematic of an x-ray laser cavity. In this embodiment of the invention, the cavity 81 is contained by the use of uranium containing multilayer mirrors 80 with a uranium containing multilayer grating 82 at the opposite ends of the cavity. The x-ray beam would escape the cavity in a beam 83 which is at the appropriate angle based upon the frequency of the laser and the parameters of the uranium containing multilayer grating 82.

Figure 9:
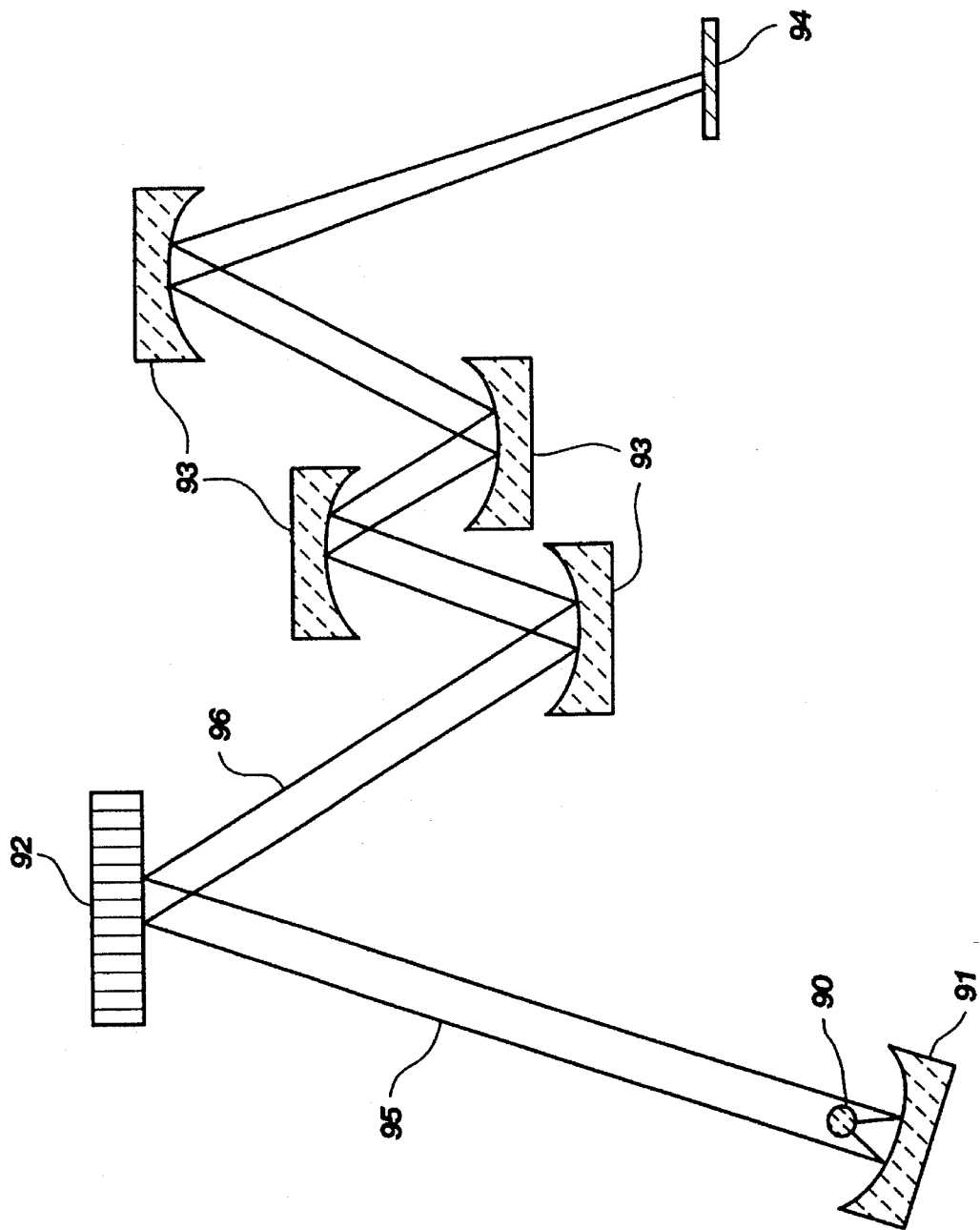
FIG. 9 is a schematic representation of an x-ray lithography system.

FIG. 9. is a schematic of an x-ray lithography system utilizing the invention. In this embodiment of the invention, the uranium containing multilayer is formed into a condenser 91 which reflects the x-rays 95 from the source 90 onto the uranium containing multilayer mask 92. The modified x-rays 96 are then directed by the uranium containing multilayer mirrors 93 to the final photo-lithographic structure. In order to get sufficient energy through the system the efficiency of the reflective coatings must be high. Uranium containing multilayers will provide high efficiency coatings at smaller wavelengths than currently used Mo/Si multilayers.

In a more preferred embodiment of uranium containing multilayers UX/LE for energies over 150 eV as for lithographic purposes, where sulfur is relatively transparent (up to 75 Å), U is uranium, X is preferably sulfur and LE is substantially sulfur or is a compound which contains substantial amounts of sulfur. In a more preferred embodiment for energies over 110 eV as for lithographic purposes, where phosphorous is relatively transparent (up to 95 Å), U is uranium, X is preferably phosphorous and LE is a compound which contains substantial amounts of phosphorous.

In a preferred embodiment, uranium containing and sulfur containing multilayers for the preferred reflection range of 80–100 Å can be prepared with monolayer epitaxy. UN/EuS and UN/lSrS multilayer possess an ultimate (theoretical) normal incidence reflectivity of % respectively. We find that these maxima are best approached with the uniform and atomically abrupt layers prepared by monolayer epitaxy. The preferred range of substrate temperature for this process is 700°±100° C. for SrS and 800°±100° C. for the EuS spacer. The preferred source of Sr and Eu species are the atomic vapors. The preferred vapor pressure for deposition is less than 1 torr and preferably less than 0.01 torr. The preferred source of the uranium species is $UCl_4$ and $UCl_3$, though the corresponding iodides and bromides were also useable. $UF_6$, though volatile, has proven to be unsuitable for nitride deposition, though it was possible to prepare uranium silicides using fluorides. The nitrogen source is ammonia, though in one embodiment plasma cracked nitrogen was usable.

Figure 10:
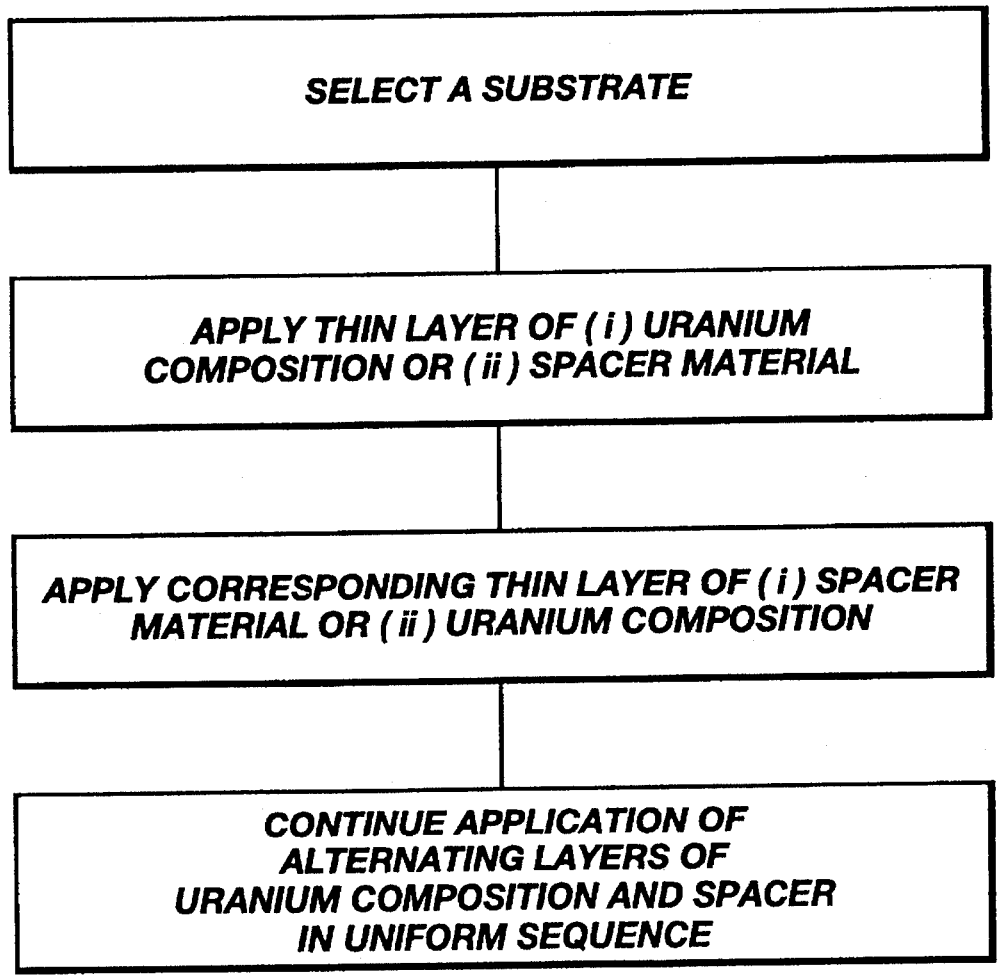
FIG. 10 depicts a block diagram of the inventive method.

In over view, the foregoing disclosure is represented by a general method for preparing a multilayer reflective device for x-ray radiation within the energy range of 100 eV to 5000 eV. This method is depicted in block diagram in FIG. 10 and comprises the steps of a) selecting a substrate having a smooth surface suitable for receiving a reflective coating operable within the x-ray energy range of 100 eV to 5000 eV;

b) applying over the substrate a thin layer of uranium composition selected from the group consisting of uranium, uranium compound, uranium alloy and mixtures thereof;

c) applying to the layer of uranium composition a thin spacer layer optically compatible with the uranium composition to enable reflection of the x-ray radiation; and d) repeating steps b) and c) sequentially to form a multiple layered device.

In summary, uranium has proven to be especially and surprisingly useful in preparing highly reflective optical multilayers for the range of 100 eV to 5000 eV. This is noteworthy since prior use of uranium as an optical element was rejected due to its negative qualities such as radioactivity, high chemical reactivity and low melting temperature. These qualities have generally been found to be incompatible with high quality x-ray optical multilayer reflectors. Many modifications and variations of the present invention are possible in light of the above teachings. While the preferred materials are set forth above, other elements can be utilized in the uranium containing and the spacer layers. It is therefore to be understood that within the scope of the appended claims, the invention may be practiced otherwise than as specifically described.

We claim:

1. A method for preparing a multilayer reflective device for x-ray radiation within the energy range of 100 eV to 5000 eV, said method comprising the following steps of step a) plus the subsequent steps of b) and c) in any order, followed by step d:

a) selecting a substrate having a smooth surface suitable for receiving a reflective coating operable within the x-ray energy range of 100 eV to 5000 eV;

b) applying over the substrate a thin layer of uranium composition selected from at least one of the group consisting of uranium, uranium compound, and uranium alloy;

c) applying to the layer of uranium composition a thin spacer layer which is optically compatible with the uranium composition to enable reflection of the x-ray radiation; and d) repeating steps b) and c) sequentially and in uniform pattern to form a multiple layered device.

2. A method as defined in claim 1, wherein at least one of the thin layers of uranium composition is deposited by a vapor deposition technique.

3. A method as defined in claim 2, wherein at least one of the thin layers of uranium composition is deposited by a sputtering technique.

4. A method as defined in claim 3, wherein the step of applying the uranium composition includes reactive ion sputtering in an atmosphere including a nitrogen compound.

5. A method as defined in claim 1, wherein step (c) comprises, more specifically, applying a spacer layer selected from the group consisting of nitrides, oxides, sulfides, hydrides, and mixtures of these compounds.

6. A method as defined in claim 5, wherein step (c) comprises, more specifically, selecting a spacer layer composition selected from the group consisting of $ScN$, $Ca_3N_2$, $Mg_3N_2$, $Be_3N_2$, $K_3N$, $Na_3N$, $TiN_{1-x}$, $ScO_{1-x}$, $CaO$, $MgO$, $BeO$, $K_2O$, $Li_2O$, $Na_2O$, $TiO_{2-x}$, $TiH_2$, $ScH_2$, $CaH_2$, $KH_x$, $MgH_2$, $NaH$, $LiH$, and mixtures of these compounds.

7. A method as defined in claim 1 wherein step (c) comprises, more specifically, applying a carbide composition as the spacer layer.

8. A method as defined in claim 7, wherein step (c) comprises, more specifically, selecting the spacer layer from a group consisting of $ScC_x$, $CaC_2$, $MgC_x$, $Be_2C$, $Li_2C_2$, $KHC_2$ and mixtures of thereof.

9. A method as defined in claim 1, wherein step (b) comprises, more specifically, applying the uranium composition by reactive ion sputtering in an atmosphere containing a hydrocarbon.

10. A method as defined in claim 9 wherein the step of reactive ion sputtering is performed in an environment which includes methane as the hydrocarbon.

11. A method as defined in claim 4 wherein the step of reactive ion sputtering is performed in an environment which includes ammonia as the nitrogen compound.

12. A method as defined in claim 1, wherein the multilayer reflective device is adapted for use within a water window application where carbon is absorbing and oxygen is relatively transparent to x-ray radiation, in that step (b) comprises, more specifically, selecting a uranium compound including carbon.

13. A method as defined in claim 1, wherein the multilayer reflective device is adapted for use within a water window application where carbon is absorbing and oxygen is relatively transparent to x-ray radiation, in that step (b) comprises, more specifically, selecting a uranium compound including a constituent selected from the group consisting of nitrogen and oxygen.

14. A method as defined in claim 1, wherein the multilayer reflective device is adapted for use within a water window application where carbon is absorbing and oxygen is relatively transparent to x-ray radiation, in that step (b) comprises, more specifically, selecting a uranium alloy including an element selected from the group consisting of Si, Co, Ni, Ta, W, Re, Os, Ir and Pt.

15. A method as defined in claim 1, wherein the multilayer reflective device is adapted for use with x-ray energies less than a carbon K edge, where boron is not absorbing and carbon, nitrogen, and oxygen are relatively transparent to x-ray radiation, in that step (b) comprises, more specifically, selecting a uranium compound which includes boron.

16. A method as defined in claim 1, further comprising the steps of:

a) positioning the substrate with applied layers of uranium compositions within an x-ray wavelength dispersive spectrometer; and b) processing a specimen within the spectrometer for detection of a predetermined element.

17. A method as defined in claim 16, wherein the step of processing the specimen with the x-ray spectrometer for detecting an element selected from the group of elements consisting of boron, carbon, nitrogen, oxygen, fluorine, sodium, magnesium, aluminum, silicon, phosphorous and sulfur.

18. A method as defined in claim 1, further comprising the steps of:
   a) positioning the multilayer reflective device with applied layers of uranium composition within a fusion diagnostic device and
   b) exposing the multilayer reflective device to x-rays generated within a fusion source so as to reflect x-rays of a desired energy to a detector.

19. A method as defined in claim 1, further comprising the steps of:
   a) positioning the multilayer reflective device with applied layers of uranium compositions at either or both ends of a laser cavity; and
   b) exposing the opposing mirror and multilayer reflective device to x-rays to generate a laser radiation output.

20. A method as defined in claim 1, further comprising the step of positioning a condenser which consists of layers of uranium composition at a reflective face oriented to receive x-ray radiation from an x-ray source and generating x-ray radiation with a desired collimation and divergence.

21. A method as defined in claim 1, further comprising the steps of positioning a plurality of the multilayered reflective devices with applied layers of uranium composition as reflective faces oriented to receive x-ray radiation from an x-ray source and imaging the x-ray radiation with a desired collimation and divergence.

22. A method for forming a uranium containing multilayer mask comprising the steps of claim 1, and further comprising the step of directing reflected x-ray radiation to the uranium containing multilayer mask for modifying the x-ray radiation for reflection to a final photo-lithographic structure.

23. A device for reflecting and dispersing soft x-rays of energy within the approximate range of 100 eV to 5000 eV, comprising:

a substrate having a smooth surface suitable for receiving a reflective coating operable within the x-ray energy range of 100 eV to 5000 eV;

a plurality of alternating thin layers respectively including (i) a uranium composition selected from the group consisting of uranium, uranium compound, and uranium alloy; and (ii) an optically compatible spacer layer composition to enable reflection of the x-ray radiation;

said layers being arranged in any alternating order and being positioned on the substrate as a reflective coating, each layer having a thickness which causes reflection or dispersion of x-rays within the range of 100 eV to 5000 eV which are incident upon the layers.

24. A device as defined in claim 23, wherein at least one of the layers including uranium composition also includes a composition selected from the group consisting of carbon, nitrogen, oxygen, halide, and combinations thereof.

25. A device as defined in claim 23, wherein the spacer layer is selected from the group consisting of nitrides, oxides, hydrides, and mixtures of theses compounds.

26. A device as defined in claim 23, wherein the spacer layer is selected from the group consisting of $ScN$, $Ca_3N_2$, $Mg_3N_2$, $Be_3N_2$, $K_3N$, $Na_3N$, $TiN_{1-x}$, $ScO_{1-x}$, $CaO$, $MgO$, $BeO$, $K_2O$, $Li_2O$, $Na_2O$, $TiO_{2-x}$, $TiH_2$, $ScH_2$, $CaH_2$, $KH_x$, $MgH_2$, $NaH$, $LiH$, and mixtures of these compounds.

* * * * *